(12) United States Patent
Lee et al.

(10) Patent No.: US 11,558,030 B2
(45) Date of Patent: Jan. 17, 2023

(54) BULK-ACOUSTIC WAVE RESONATOR

(71) Applicant: Samsung Electro-Mechanics Co., Ltd., Suwon-si (KR)

(72) Inventors: Tae Kyung Lee, Suwon-si (KR); Ran Hee Shin, Suwon-si (KR); Jin Suk Son, Suwon-si (KR); Je Hong Kyoung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 700 days.

(21) Appl. No.: 16/591,862

(22) Filed: Oct. 3, 2019

(65) Prior Publication Data

US 2021/0006226 A1 Jan. 7, 2021

(30) Foreign Application Priority Data

Jul. 3, 2019 (KR) .................. 10-2019-0080123

(51) Int. Cl.
*H03H 9/13* (2006.01)
*H03H 9/17* (2006.01)
*H03H 9/02* (2006.01)

(52) U.S. Cl.
CPC ........ *H03H 9/131* (2013.01); *H03H 9/02015* (2013.01); *H03H 9/174* (2013.01)

(58) Field of Classification Search
CPC .... H03H 9/131; H03H 9/02015; H03H 9/174; H03H 9/02086; H03H 9/173; H03H 3/02; H03H 9/02; H03H 9/171; H03H 2003/023; H03H 2003/028; H03H 2003/0421; H03H 2003/0428; H03H 2009/02173

See application file for complete search history.

(56) References Cited

U.S. PATENT DOCUMENTS

| | | | |
|---|---|---|---|
| 6,933,809 B2 | 8/2005 | Kyoung et al. | |
| 10,587,241 B2* | 3/2020 | Zou | ........... H03H 9/171 |
| 2011/0304412 A1* | 12/2011 | Zhang | ........... H03H 9/588 29/25.35 |

(Continued)

FOREIGN PATENT DOCUMENTS

| | | |
|---|---|---|
| JP | 2015-99988 A | 5/2015 |
| KR | 10-2019-0004627 A | 1/2019 |
| KR | 10-2019-0019813 A | 2/2019 |

OTHER PUBLICATIONS

Received STIC search report from EIC 2800 searcher Emily P Huston for claim 1 dated May 20, 2022. (Year: 2022).*

(Continued)

*Primary Examiner* — Shawki S Ismail
*Assistant Examiner* — Htet Z Kyaw
(74) *Attorney, Agent, or Firm* — NSIP Law

(57) ABSTRACT

A bulk-acoustic wave resonator may include: a substrate; a resonance portion; a first electrode disposed on the substrate; a piezoelectric layer disposed on the first electrode in the resonance portion; a second electrode disposed on the piezoelectric portion in the resonance portion; and a seed layer disposed in a lower portion of the first electrode. The seed layer may be formed of titanium (Ti) having a hexagonal close packed (HCP) structure, or an alloy of Ti having the HCP structure. The seed layer may have a thickness greater than or equal to 300 Å and less than or equal to 1000 Å, or may be thinner than the first electrode.

14 Claims, 14 Drawing Sheets

(56) References Cited

U.S. PATENT DOCUMENTS

| | | | | |
|---|---|---|---|---|
| 2012/0056694 A1* | 3/2012 | Pang | ........... | H03H 9/02149 |
| | | | | 333/187 |
| 2013/0027153 A1* | 1/2013 | Shin | ........... | H03H 9/588 |
| | | | | 310/341 |
| 2014/0132117 A1* | 5/2014 | Larson, III | ........... | C23C 14/3414 |
| | | | | 204/192.1 |
| 2014/0340172 A1* | 11/2014 | Bradley | ........... | H03H 9/02015 |
| | | | | 333/187 |
| 2015/0137908 A1 | 5/2015 | Nishihara et al. | | |
| 2016/0301380 A1* | 10/2016 | Lee | ........... | H03H 9/587 |
| 2017/0288122 A1* | 10/2017 | Zou | ........... | H03H 9/175 |
| 2017/0366159 A1* | 12/2017 | Shin | ........... | H03H 9/588 |
| 2017/0373665 A1* | 12/2017 | Lee | ........... | H03H 9/54 |
| 2018/0013401 A1* | 1/2018 | Lee | ........... | H03H 9/173 |
| 2019/0013792 A1 | 1/2019 | Lee et al. | | |
| 2019/0058451 A1 | 2/2019 | Lee et al. | | |
| 2019/0245509 A1* | 8/2019 | Hurwitz | ........... | H03H 9/02031 |
| 2019/0326880 A1* | 10/2019 | Figueredo | ........... | H03H 9/02102 |

OTHER PUBLICATIONS

Received STIC search report from EIC 2800 searcher Benyam Solomon for claim 9 dated May 23, 2022. (Year: 2022).*
Received STIC search report from EIC 2800 searcher Francisco Cueto for claim 14 dated May 23, 2022. (Year: 2022).*

* cited by examiner

| Material | Crystal | | | Lattice constant | | Seed layer–First electrode Lattice mismatch (%) |
|---|---|---|---|---|---|---|
| | Structure | Plane | Space group | a(Å) | c(Å) | |
| First electrode (Mo) | BCC | (110) | Im3m | 3.147 | 4.147 | – |
| AlN seed layer | HCP | (0002) | P6₃mc | 3.112 | 4.982 | 14.11 |
| Ti seed layer | HCP | (0002) | P6₃mc | 2.98 | 43685 | 8.24 |

FIG. 5

| Material | Crystal | | | Lattice constant | | First electrode–piezoelectric layer Lattice mismatch (%) |
|---|---|---|---|---|---|---|
| | Structure | Plane | Space group | a(Å) | c(Å) | |
| Piezoelectric layer (AlScN) | HCP | (0002) | P6₃mc | 3.112 | 4.982 | – |
| First electrode (Mo) | BCC | (110) | Im3m | 3.147 | 3.147 | 14.11 |
| Barrier layer (Ti) | HCP | (0002) | P6₃mc | 2.95 | 43685 | 5.42 |

FIG. 6

| No. | Classification | seed layer | Resistivity (uohm.cm) | First electrode FWHM (°) | Resonator insertion loss (dB), 70 x 70 μm² | Resonator insertion loss improvement (△dB) |
|---|---|---|---|---|---|---|
| 1 | AlN seed layer (Ref.) | AlN 500 Å | 15.117 | 2.462 | 0.065 | |
| 2 | Ti seed layer | Ti 500 Å | 13.827 | 1.633 | 0.041 | 0.024 |

FIG. 7

BULK-ACOUSTIC WAVE RESONATOR

CROSS-REFERENCE TO RELATED APPLICATIONS

This application claims the benefit under 35 U.S.C. § 119(a) of Korean Patent Application No. 10-2019-0080123 filed on Jul. 3, 2019 in the Korean Intellectual Property Office, the entire disclosure of which is incorporated herein by reference for all purposes.

BACKGROUND

1. Field

The following description relates to a bulk-acoustic wave resonator.

2. Description of Related Art

In accordance with the trend of miniaturization of wireless communication devices, miniaturization of high frequency component technology is being demanded. For example, a bulk acoustic wave (BAW) type filter using semiconductor thin film wafer manufacturing technology may be provided.

A BAW resonator is a thin film device in which a piezoelectric dielectric material is deposited on a silicon wafer, which is a semiconductor substrate. The BAW resonator is implemented as a filter by using piezoelectric characteristics of the BAW resonator to induce resonance.

Recently, there has been growing technical attention to 5G communications, and development of technology that can be implemented in candidate bands is being performed.

In the case of 5G communications using the Sub 6 GHz (4 GHz to 6 GHz) frequency band, however, a band width increases, which decreases a communication distance. In this regard, signal strength or power may increase. Further, as the frequency increases, loss occurring in a piezoelectric layer or a resonance portion may increase.

Accordingly, a bulk-acoustic wave resonator capable of enduring higher power and minimizing loss occurring in a piezoelectric layer is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a substrate; a resonance portion; a first electrode disposed on the substrate; a piezoelectric layer disposed on the first electrode in the resonance portion; a second electrode disposed on the piezoelectric portion in the resonance portion; and a seed layer disposed in a lower portion of the first electrode. The seed layer is formed of titanium (Ti) having a hexagonal close packed (HCP) structure, or an alloy of Ti having the HCP structure. The seed layer has a thickness greater than or equal to 300 Å and less than or equal to 1000 Å, or is thinner than the first electrode.

The piezoelectric layer may include aluminum nitride (AlN) or AlN comprising scandium (Sc).

The piezoelectric layer may be formed of aluminum nitride including 20 wt % to 40 wt % of Sc.

The first electrode may be formed of molybdenum (Mo).

The bulk-acoustic wave resonator may further include an insertion layer partially disposed in the resonance portion and disposed between the first electrode and the piezoelectric layer. The piezoelectric layer may be partially raised by the insertion layer.

The insertion layer may have an inclined surface. The piezoelectric layer may have an inclined portion disposed on the inclined surface.

An end of the second electrode may be disposed on the inclined portion.

The piezoelectric layer may include an extension portion disposed on an external side of the inclined portion. At least a portion of the second electrode may disposed on the extension portion.

In another general aspect, a bulk-acoustic wave resonator includes: a substrate; a resonance portion; a first electrode disposed on the substrate; a piezoelectric layer disposed on the first electrode in the resonance portion; a second electrode disposed on the piezoelectric layer in the resonance portion; and a barrier layer disposed between the piezoelectric layer and the first electrode. The barrier layer is formed of titanium (Ti) having a hexagonal close packed (HCP) structure or an alloy of Ti having the HCP structure. The barrier layer has a thickness of 100 Å to 900 Å.

The piezoelectric layer may include aluminum nitride (AlN) or AlN comprising scandium (Sc).

The piezoelectric layer may be formed of aluminum nitride including 20 wt % to 40 wt % of Sc.

The first electrode may be formed of molybdenum (Mo).

The bulk-acoustic wave resonator may further include an insertion layer partially disposed in the resonance portion and disposed between the first electrode and the piezoelectric layer. The piezoelectric layer may be partially raised by the insertion layer.

In another general aspect, a bulk-acoustic wave resonator includes: a substrate; a resonance portion; a first electrode disposed on the substrate; a piezoelectric layer disposed on the first electrode in the resonance portion; a second electrode disposed on the piezoelectric layer in the resonance portion; a seed layer disposed in a lower portion of the first electrode; and a barrier layer disposed between the piezoelectric layer and the first electrode. The seed layer and the barrier layer are formed of titanium (Ti) having a hexagonal close packed (HCP) structure or an alloy of Ti having the HCP structure.

A thickness of the seed layer may be 300 Å to 1000 Å.

A thickness of the barrier layer may be 100 Å to 900 Å.

The bulk-acoustic wave resonator may further include an insertion layer partially disposed in the resonance portion and disposed between the first electrode and the piezoelectric layer. The piezoelectric layer may be partially raised by the insertion layer.

Other features and aspects will be apparent from the following detailed description, the drawings, and the claims.

BRIEF DESCRIPTION OF DRAWINGS

FIG. 5 is a diagram showing a result of measurement of lattice mismatch between a first electrode and a seed layer.

FIG. 6 is a diagram showing a result of measurement of lattice mismatch between the first electrode and a piezoelectric layer;

FIG. 7 is a diagram showing a result of measurement of crystal orientation of the first electrode.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
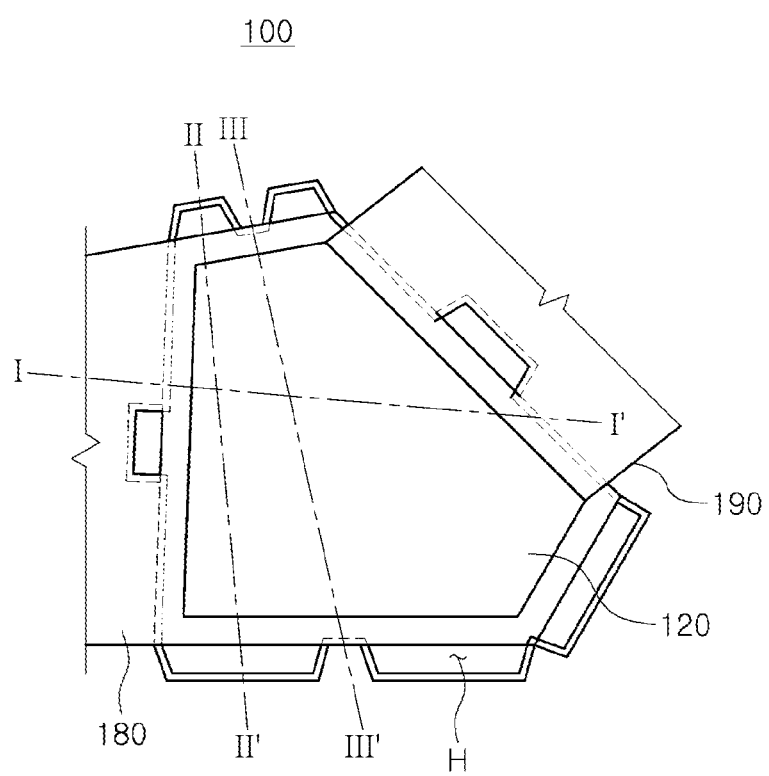
FIG. 1 is a plan view illustrating a wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

According to an aspect of this disclosure, a bulk-acoustic wave resonator is capable of improving operational reliability by minimizing loss of a piezoelectric layer. According to another aspect of this disclosure, a bulk-acoustic wave resonator is capable of improving operational reliability by minimizing insertion loss of the bulk-acoustic wave resonator due to reduction of resistivity of an electrode.

Figure 2:
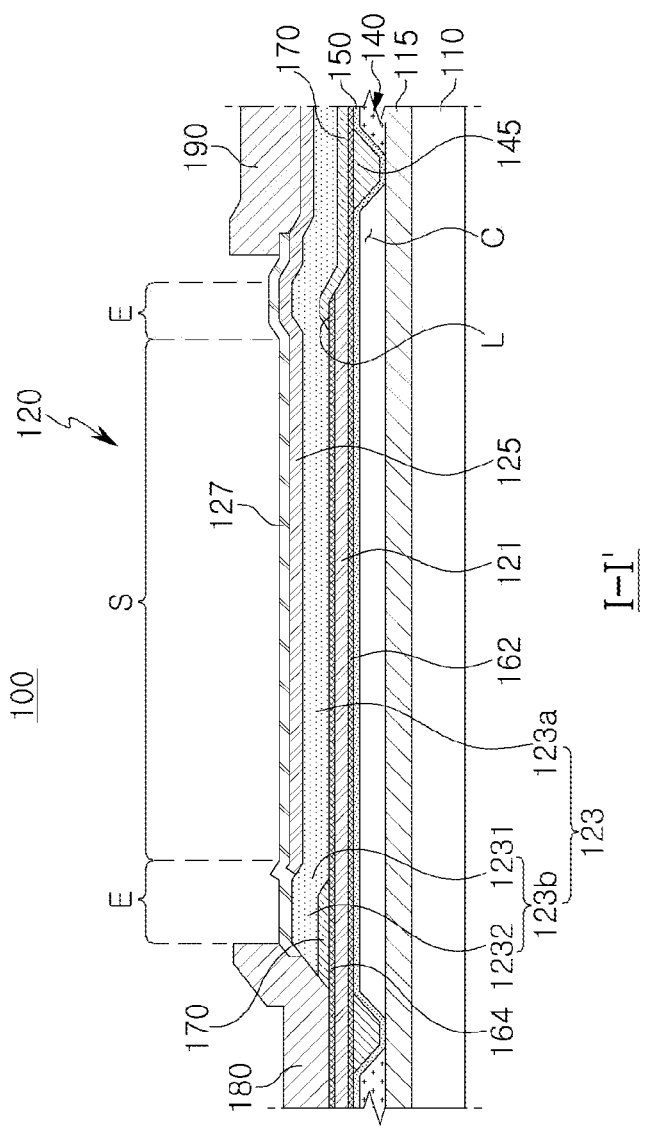
FIG. 2 is a cross-sectional view taken along line I-I' of FIG. 1.
Figure 3:
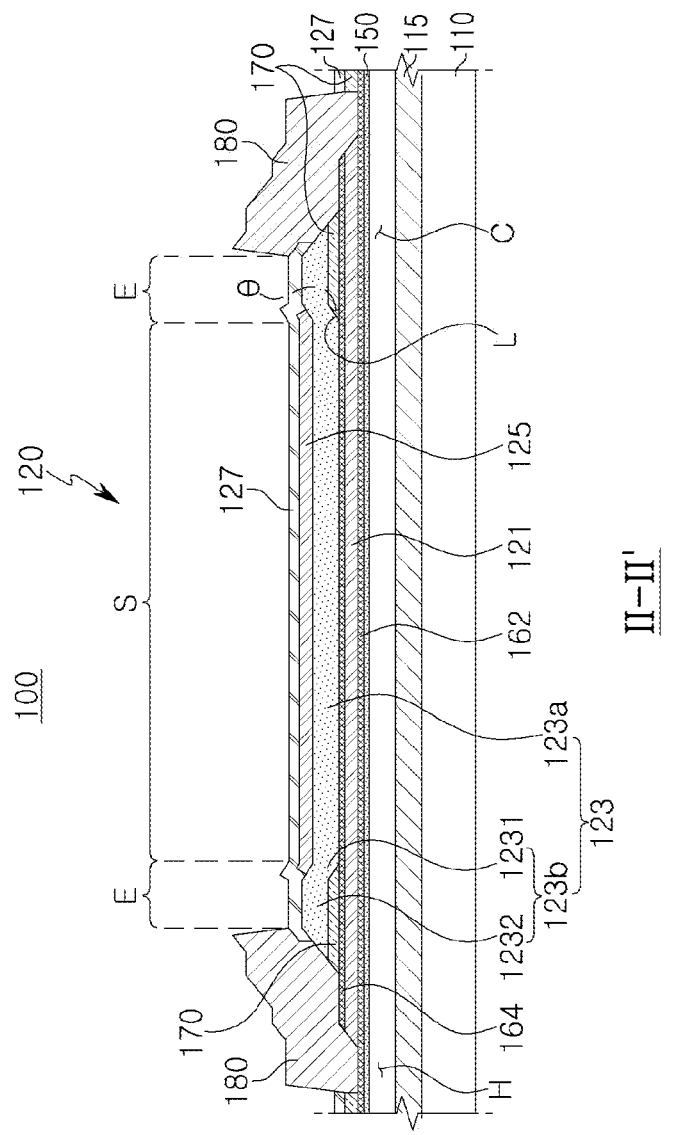
FIG. 3 is a cross-sectional view taken along line II-II' of FIG. 1.
Figure 4:
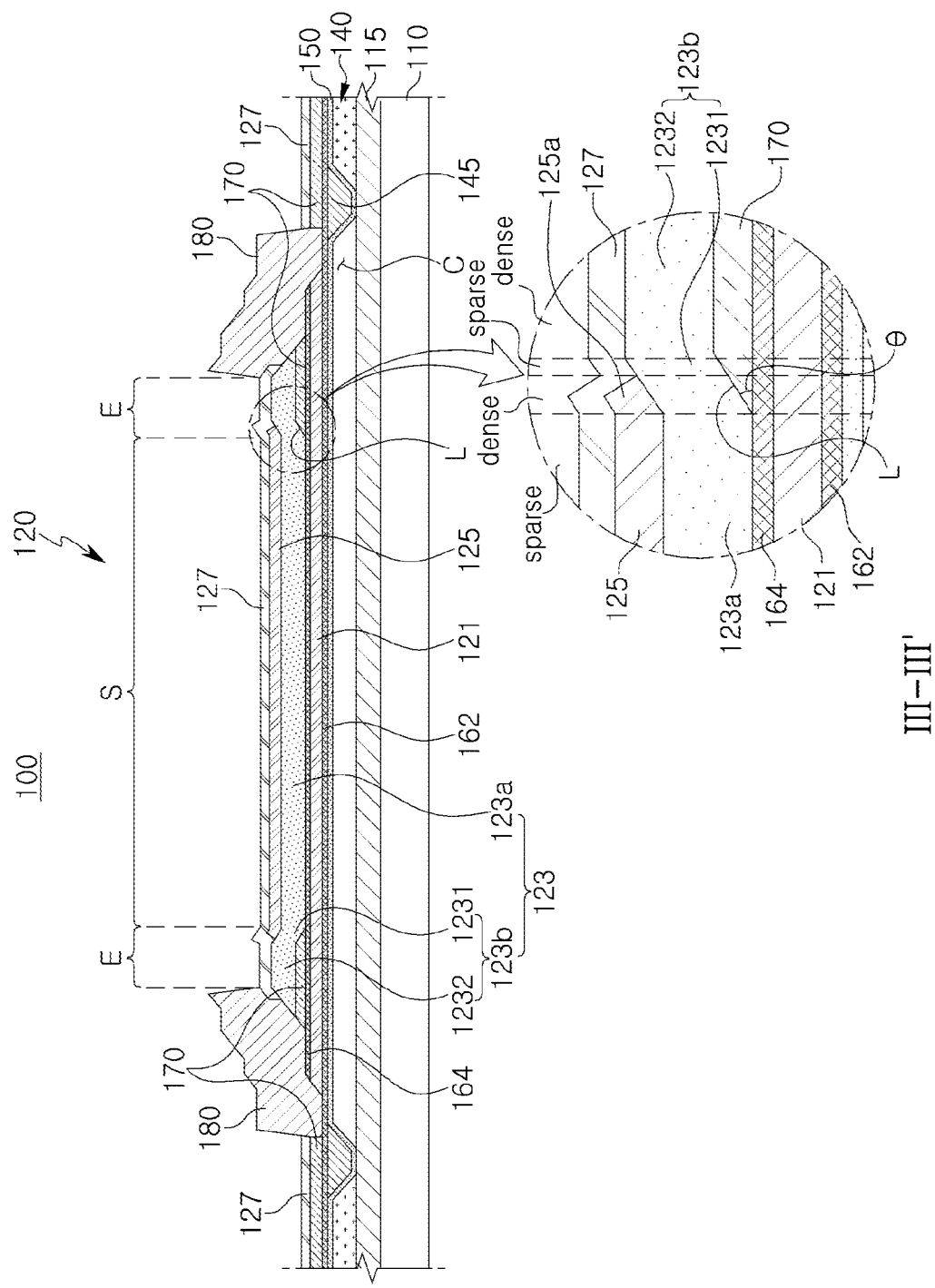
FIG. 4 is a cross-sectional view taken along line III-III' of FIG. 1.

FIG. 1 is a plan view illustrating a wave resonator 100, according to an embodiment. FIG. 2 is a cross-sectional view taken along line I-I' of FIG. 1. FIG. 3 is a cross-sectional view taken along line II-II' of FIG. 1. FIG. 4 is a cross-sectional view taken along line III-III' of FIG. 1.

Referring to FIGS. 1 through 4, the wave resonator 100 may be a bulk-acoustic wave (BAW) resonator, and may include a substrate 110, a sacrificial layer 140, a resonance portion 120, and an insertion layer 170.

The substrate 110 may be a silicon substrate. For example, the substrate 110 may be a silicon wafer or a silicon on insulator (SOI) type-substrate.

An insulating layer 115 may be disposed on a top surface of the substrate 110 and may electrically isolate the substrate 110 and the resonance portion 120 from each other. In addition, the insulating layer 115 may prevent the substrate 110 from being etched by an etching gas when forming a cavity C during manufacturing of the bulk-acoustic wave resonator 100.

The insulating layer 115 may be formed of at least one of silicon dioxide ($SiO_2$), silicon nitride ($Si_3N_4$), aluminum oxide ($Al_2O_2$) and aluminum nitride (AlN), and may be formed by any of a chemical vapor deposition process, a radio frequency (RF) magnetron sputtering process, and an evaporation process.

The sacrificial layer 140 may be disposed on the insulating layer 115, and the cavity C and an etching preventing portion 145 may be disposed in the sacrificial layer 140.

The cavity C is formed of an empty space and may be formed by removing a portion of the sacrificial layer 140.

Since the cavity C is formed in the sacrificial layer 140, the resonance portion 120 may be formed to be flat on an upper portion of the sacrificial layer 140.

The etching preventing portion 145 is disposed along a boundary of the cavity C. The etching preventing portion 145 is disposed to prevent etching from progressing beyond the cavity area during formation of the cavity C.

A membrane layer 150 is formed on the sacrificial layer 140 and forms an upper surface of the cavity C. Accordingly, the membrane layer 150 is formed of a material not easily removed during the formation of the cavity C.

For example, when a halide etching gas such as fluoride (F), chloride (Cl), or the like, is used to remove a portion of the sacrificial layer 140 (for example, the cavity area), the membrane layer 150 may be formed of a material having low reactivity to the etching gas. In this case, the membrane layer 150 may include at least one of silicon oxide ($SiO_2$) or silicon nitride ($Si_3N_4$).

In addition, the membrane layer 150 may be formed of a dielectric layer containing any one or any combination of any two or more of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) or a metal layer containing any one or any combination of any two or more of aluminum (Al), nickel (Ni), chromium (Cr), platinum (Pt), gallium (Ga) and hafnium (Hf). However, the membrane layer 150 is not limited to the foregoing examples.

The resonance portion 120 includes a first electrode 121, a piezoelectric layer 123 and a second electrode 125. The first electrode 121, the piezoelectric layer 123 and the second electrode 125 are laminated on the resonance portion 120 in the order in which they are listed herein. Accordingly, the portion of the piezoelectric layer 123 disposed in the resonance portion 120 is disposed between the first electrode 121 and the second electrode 125.

Since the resonance portion 120 is formed on the membrane layer 150, the membrane layer 150, the first electrode 121, the piezoelectric layer 123 and the second electrode 125 are laminated in the aforementioned order on the substrate 110 to form the resonance portion 120.

The resonance portion 120 may generate a resonant frequency and an anti-resonance frequency by resonating the piezoelectric layer 123 according to signals applied to the first and second electrodes 121 and 125.

The resonance portion 120 may include a center portion S, on which the first electrode 121, the piezoelectric layer 123 and the second electrode 125 are stacked to be substantially flat, and an extension portion E on which an insertion layer 170 is interposed between the first electrode 121 and the piezoelectric layer 123.

The center portion S is a region disposed in a center of the resonance portion 120 where the extension portion E is a region disposed along a periphery of the center portion S. Accordingly, the extension portion E is a region extending outwardly from the center portion and refers to a region formed in the shape of continuous rings along the periphery of the center portion S. If necessary, however, the extension portion E may be in the shape of discontinuous rings from which a portion is removed.

As shown in FIG. 2, the extension portion E in the cross-section of the resonance portion 120 taken on the line I-I' (FIG. 1) through the center portion S is disposed on both ends of the center portion S. Further, the insertion layer 170 is disposed in the extension portion E on both ends of the center portion S.

The insertion layer 170 has an inclined surface L having a thickness that increases in a direction away from the center portion S.

In the extension portion E, the piezoelectric layer 123 and the second electrode 125 are disposed on the insertion layer 170. Accordingly, the portions of the piezoelectric layer 123 and the second electrode 125 disposed on the extension portion E have inclined surfaces corresponding to the inclined surface L of the insertion layer 170.

In an embodiment, the extension portion E is included in the resonance portion 120, and accordingly, there may be resonance occurring in the extension portion E, but the present disclosure is not limited thereto. According to the structure of the extension portion E, resonance may occur only in the center portion S, and may not occur in the extension portion E.

The first electrode 121 and the second electrode 125 may be formed of a conductive material, for example, gold, molybdenum, ruthenium, iridium, aluminum, platinum, titanium, tungsten, palladium, tantalum, chromium, nickel or a metal including any one or any combination of any two or more thereof. However, the first electrode 121 and the second electrode 125 are not limited to the listed materials.

The first electrode 121 and the second electrode 125 are formed to have a larger surface area in the resonance portion 120 than a surface area thereof outside of the resonance portion. A first metal layer 180 is disposed along an outer edge of the first electrode 121 on the first electrode 121. Accordingly, the first metal layer 180 may be spaced apart from the second electrode 125 by a certain distance and may be disposed so as to surround the resonance portion 120.

Being disposed on the membrane layer 150, the first electrode 121 is formed to be flat overall. In contrast, the second electrode 125 is disposed on the piezoelectric layer 123, and thus a curve may be formed in the second electrode 125 to correspond to the shape of the piezoelectric layer 123.

The first electrode 121 may be used as either one of an input electrode and an output electrode, which respectively input and output an electrical signal such as a radio frequency (RF) signal, or the like.

The second electrode 125 is disposed throughout the entirety of the center portion S, and partially in the extension portion E. The second electrode 125 may include a portion disposed on a piezoelectric portion 123a of the piezoelectric layer 123 and a portion disposed on a curved portion 123b of the piezoelectric layer 123.

For example, in an embodiment, the second electrode 125 is disposed to cover the entire piezoelectric portion 123*a* and part of an inclined portion 1231 of the piezoelectric layer 123. Accordingly, a portion 125*a* (FIG. 4) of the second electrode disposed in the extension portion E is formed to have a smaller surface area, and the second electrode 125 is formed to have a smaller surface area than the piezoelectric layer 123 in the resonance portion 120.

Accordingly, as shown in FIG. 2, an end of the second electrode 125 is disposed in the extension portion E in a cross-section of the resonance portion 120 taken on the line I-I' (FIG. 1) through the center portion S. Further, the end of the second electrode 125 disposed in the extension portion E partially overlaps with the insertion layer 170. As used herein, the term "overlap" means that when the second electrode 125 is projected on a flat surface on which the insertion layer 170 is disposed, the shape of the second electrode 125 projected on the flat surface overlaps with that of the insertion layer 170.

The second electrode 125 may be used as either one of an input electrode and an output electrode, which respectively input and output an electrical signal such as a radio frequency (RF) signal, or the like. That is, when the first electrode 121 is used as an input electrode, the second electrode 125 is used as an output electrode, whereas when the first electrode 121 is used as an output electrode, the second electrode 125 is used as an input electrode.

As shown in FIG. 4, when an end of the second electrode 125 is disposed on the inclined portion 1231 of the piezoelectric layer 123, acoustic impedance of the resonance portion 120 is formed to have a sparse/dense/sparse/dense structure from the center portion S, thereby increasing a reflective interface reflecting a lateral wave into the resonance portion 120. Accordingly, most of the lateral waves do not escape outside of the resonance portion 120 but are reflected into the resonance portion 120, and the bulk-acoustic wave resonator 100 may have improved performance.

The piezoelectric layer 123 creates a piezoelectric effect, which converts electrical energy into mechanical energy in elastic wave form, and is formed on the first electrode 121 and the insertion layer 170.

Zinc oxide (ZnO), aluminum nitride (AlN), doped aluminum nitride, lead zirconate titanate, quartz, or the like, can be selectively used as a material of the piezoelectric layer 123. The doped aluminum nitride may further include a rare earth metal, a transition metal or an alkaline earth metal. The rare earth metal may include any one or any combination of any two or more of scandium (Sc), erbium (Er), yttrium (Y) and lantan (La). The transition metal may include any one or any combination of any two or more of hafnium (Hf), titanium (Ti), zirconium (Zr), tantalum (Ta) and niobium (Nb). The alkaline earth metal may include magnesium (Mg).

When amounts of atoms doped in AlN to improve piezoelectric properties are less than 0.1 at %, improved piezoelectric properties cannot be implemented compared to those of AlN. When amounts of atoms doped in AlN are greater than 30 at %, manufacturing of a sputtering target for deposition and composition control are difficult, resulting in an uneven phase.

Accordingly, the amounts of the atoms doped in AlN in an embodiment are in the range of 0.1 at % to 30 at %.

In an embodiment, the piezoelectric layer 123 is formed by doping Sc in AlN. In this case, a piezoelectric constant increases, thereby increasing $Kt^2$ of the wave resonator. However, the disclosure is not limited to such an embodiment.

The piezoelectric layer 123 according to an embodiment includes a piezoelectric portion 123*a* disposed on the center portion S and a curved portion 123*b* disposed on the extension portion E.

The piezoelectric portion 123*a* is directly stacked on an upper surface of the first electrode 121. Accordingly, the piezoelectric portion 123*a* is interposed between the first electrode 121 and the second electrode 125 and formed to be flat, along with the first electrode 121 and the second electrode 125.

The curved portion 123*b* is defined as a region extending outwardly from the piezoelectric portion 123*a* to a position in the extension portion E.

The curved portion 123*b* is disposed on the insertion layer 170 and is formed to have a shape, in which an upper surface is uplifted, conforming to the insertion layer 170. In this regard, the piezoelectric layer 123 is curved at a boundary of the piezoelectric portion 123*a* and the curved portion 123*b*, and the curved portion 123*b* is uplifted in accordance with a thickness and a shape of the insertion layer.

The curved portion 123*b* may include the inclined portion 1231 and an extension portion 1232.

The inclined portion 1231 is a region formed to be inclined along the inclined surface L of the insertion layer 170. The extension portion 1232 is a region extending outward from the inclined portion 1231.

The inclined portion 1231 is formed to be parallel to the inclined surface L of the insertion layer 170, and an angle of inclination of the inclined portion 1231 may be the same as that of the inclined surface L of the insertion layer 170.

The insertion layer 170 is disposed along a surface formed by the etching preventing portion 145, and the membrane layer 150 and the first electrode 121. Accordingly, the insertion layer 170 is partially disposed in the resonance portion 120 and between the first electrode 121 and the piezoelectric layer 123.

The insertion layer 170 is disposed around the center portion S to support the curved portion 123*b* of the piezoelectric layer 123. Accordingly, the curved portion 123*b* of the piezoelectric layer 123 may include the inclined portion 1231 and the extension portion 1232 configured in accordance with the insertion layer 170.

The insertion layer 170 is disposed in a region excluding the center portion S. For example, the insertion layer 170 may be disposed on the entire substrate 110 excluding a center portion S thereof or part of the substrate 110 excluding the center portion S.

A thickness of the insertion layer 170 increases in a direction away from the center portion S. In this regard, a side surface of the insertion layer 170 adjacent to the center portion S may be the inclined surface L having a predetermined angle of inclination θ.

If the angle of inclination θ of the side surface of the insertion layer 170 were less than 5°, the insertion layer 170 would need to be very thin, or would need to have an excessively large surface area of the inclined surface L in order to manufacture the insertion layer 170, thereby making the insertion layer 170 substantially difficult to implement.

In addition, if the angle of inclination θ of the side surface of the insertion layer 170 were greater than 70°, an angle of inclination of a portion of the piezoelectric layer 123 stacked on the insertion layer 170 or an angle of inclination a portion of the second electrode 125 stacked on the insertion layer 170 may be greater than 70°. In such a case, the portion of the piezoelectric layer 123 stacked on the inclined surface L or the second electrode 125 may be excessively curved, thereby creating a crack in the curved portion.

Therefore, in an embodiment, the angle of inclination θ of the inclined surface L may be in a range of 5° to 70°.

Meanwhile, in an embodiment, the inclined portion 1231 of the piezoelectric layer 123 is formed along the inclined surface L of the insertion layer 170, and thus is formed to have the same angle of inclination as that of the inclined surface L of the insertion layer 170. Accordingly, the angle of inclination of the inclined portion 1231 is in the same range of 5° to 70° as that of the inclined surface L of the insertion layer 170. Such a configuration is applied substantially identically to the second electrode 125, which is stacked on the inclined surface L of the insertion layer 170.

The insertion layer 170 may be formed of a dielectric substance such as silicon dioxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from that of the piezoelectric layer 123.

In addition, the material of the insertion layer 180 may also be a metal. As heat is generated in the resonance portion 120 when the bulk-acoustic wave resonator 100 is used in 5G communications, it is necessary for the heat generated in the resonance portion 120 to be smoothly released. To this end, the insertion layer 170 may be formed of an aluminum alloy containing Sc.

The resonance portion 120 is spaced apart from the substrate 110 through the cavity C, which is formed as an empty space.

The cavity C may be formed by supplying etching gas (or an etching solution) through an inflow hole (H of FIG. 1) and removing a portion of the sacrificial layer 140 at the time of manufacturing the bulk-acoustic wave resonator 100.

A protective layer 127 disposed along an external surface of the bulk-acoustic wave resonator 100 protects the bulk-acoustic waver resonator 100 from the outside environment. The protective layer 127 may be disposed along an external surface that is formed by the second electrode 125 and the curved portion 123*b* of the piezoelectric layer 123.

A dielectric layer including any one or any combination of any two or more of silicon nitride ($Si_3N_4$), silicon dioxide ($SiO_2$), manganese oxide (MnO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$) and zinc oxide (ZnO) may be provided as the protective layer 127, but the protective layer 127 is not limited to the aforementioned examples.

The protective layer 127 may be formed of a single layer. However, if necessary, the protective layer 127 may be formed by stacking two layers formed of different materials. The protective layer 127 may be partially removed to adjust a frequency in a final manufacturing process. For example, a thickness of the protective layer 127 may be adjusted in a process following disposing the protective layer 127 in the bulk-acoustic waver resonator 100.

The first electrode 121 and the second electrode 125 may extend to sides of the bulk-acoustic wave resonator 100 external of the resonance portion 120. A first metal layer 180 and a second metal layer 190 may be formed on an upper surface of the region formed by the extension of the first electrode 121 and the second electrode 125, respectively.

The first metal layer 180 and the second metal layer 190 may be formed of gold (Au), a gold-tin (Au—Sn) alloy, copper (Cu), a copper-tin (Cu—Sn) alloy, aluminum (Al), an aluminum alloy, or the like. The aluminum alloy may be an aluminum-germanium (Al—Ge) alloy or an aluminum-scandium (Al—Sc) alloy.

The first metal layer 180 and the second metal layer 190 may function as a connection wire electrically connecting the electrodes 121 and 125, respectively, to an electrode of another bulk-acoustic wave resonator disposed adjacent to the bulk-acoustic wave resonator 100, or may function as an external connection terminal. However, the first and second metal layers 180 and 190 are not limited to the described configurations.

The first metal layer 180 penetrates through the protective layer 127 to be in contact with the first electrode 121.

In addition, the first electrode 121 is formed to have an area larger than an area of the second electrode 125 in the resonance portion 120, and a first metal layer 180 is formed along a periphery of the first electrode 121.

Accordingly, the first metal layer 180 may be disposed along a periphery of the resonance portion 120, and thus may surround the second electrode 125.

The piezoelectric layer 123 may be formed by doping an element such as Sc in AlN to widen a band width of the resonance portion 120. As previously described, when the piezoelectric layer 123 is formed by doping Sc in AlN, a piezoelectric constant increases, thereby increasing $Kt^2$ of the bulk-acoustic wave resonator 100.

In order for the bulk-acoustic waver resonator 100 to be used in 5G communications, the piezoelectric layer 123 needs to have a high piezoelectric constant enabling the piezoelectric layer 123 to smoothly function in a corresponding frequency. As a result of measurement, it was shown that the piezoelectric layer 123 needs to include at least 20 wt % Sc in AlN. Therefore, the piezoelectric layer 123, according to an embodiment, is formed of AlScN containing at least 20 wt % Sc.

The Sc content is defined based on the weight of aluminum and scandium. That is, 20 wt % of the Sc content refers to 20 g of the scandium weight when the total weight of aluminum and scandium is 100 g.

The piezoelectric layer 123 is formed by a sputtering process, and a sputtering target used in the sputtering process is an aluminum-scandium (AlSc) target, manufactured through melting involving melting the aluminum and the scandium and hardening the same.

When an AlSc target has an Sc content of 40 wt % or more, not only is an $Al_3Sc$ phase formed, but also an $Al_2Sc$ phase is formed. This causes a problem in that the target easily breaks during handling process thereof due to the fragile $Al_2Sc$ phase.

Therefore, in an embodiment, the piezoelectric layer 123 is formed of an AlScN material containing 20 wt % to 40 wt % Sc.

When the amount of the doped Sc increases to be more than 20 wt %, probability of rapid crystal growth in a corner crystal direction increases in the HCP crystal structure of AlN, thereby exponentially increasing a frequency of abnormal growth. Accordingly, when the content of a doped element excessively increases, the loss in the piezoelectric layer 123 may increase due to abnormal growth.

Figure 14:
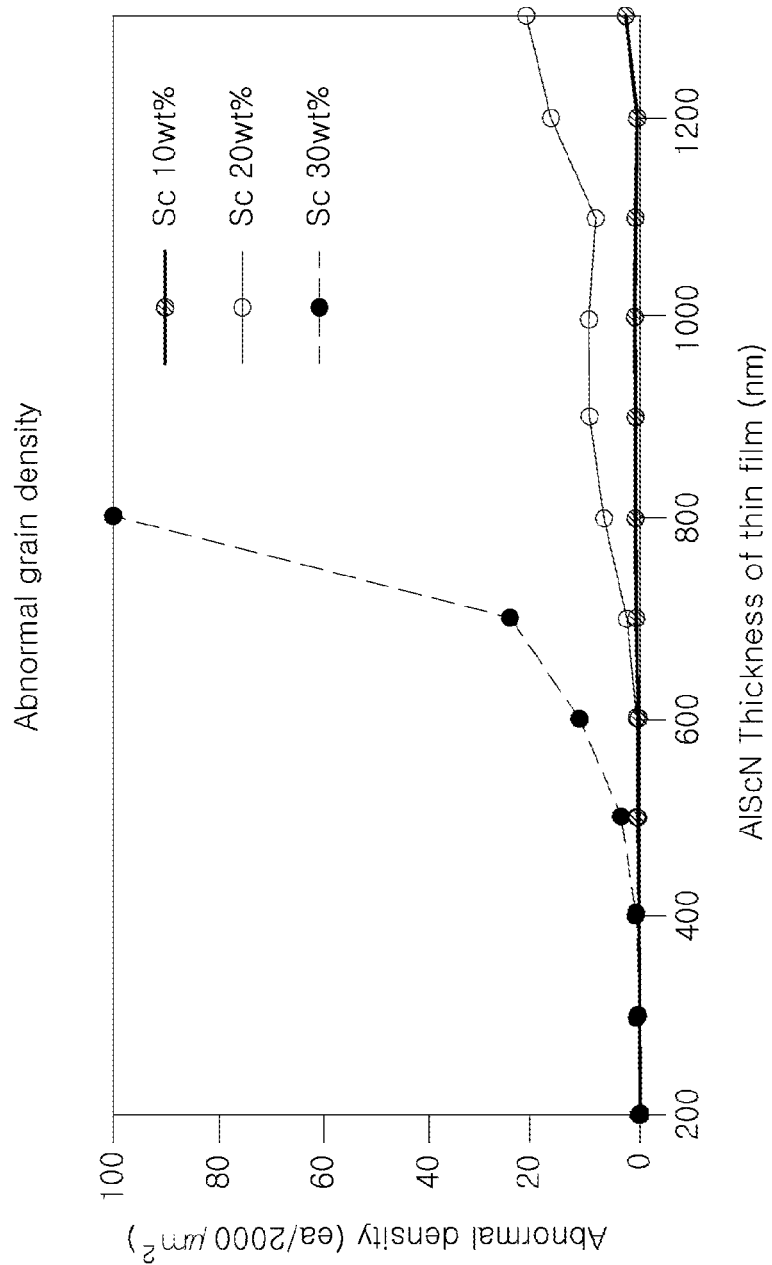
FIG. 14 is a graph illustrating measurement of abnormal growth of an AlScN thin film according to a content of scandium (Sc).

FIG. 14 is a graph illustrating measurement of abnormal growth of an AlScN thin film according to a content of Sc. It is shown in FIG. 14 that when the Sc content is 20 wt % or more, abnormal growth significantly increases.

Accordingly, in order to configure the Sc amount to be 20 wt % or more, it is necessary to provide improved crystal orientation to suppress abnormal growth.

Additionally, the resonance portion 120 for 5G communication should be thinner as the frequency thereof increases. However, when the thickness of the piezoelectric layer 123 decreases, an amount of leakage current leaking from the piezoelectric layer 123 tends to increase.

In this regard, when the abnormal growth rate increases in the piezoelectric layer 123, the loss may further increase in the piezoelectric layer 123, and the piezoelectric layer 123 may be damaged under a high power condition.

To this end, the bulk-acoustic wave resonator 100 may have a seed layer 162 disposed on a lower portion of the first electrode 121 and a barrier layer 164 disposed on an upper portion of the first electrode 121, between the first electrode 121 and the piezoelectric layer 123.

The seed layer 162 is disposed in the lower portion of the first electrode 121, and therefore is disposed between the first electrode 121 and the membrane layer 150, thereby functioning as a seed for the formation of the first electrode 121.

The seed layer 162 in the embodiment is formed of a metal having a hexagonal close-packed (HCP) structure. In this case, lattice mismatch with the first electrode 121 may decrease, and a surface resistance of the first electrode 121 may improve. As an example for such effect, the seed layer 162 may include a titanium (Ti) material. For example, the seed layer 162 may be implemented with a Ti layer.

FIG. 5 is a diagram showing a result of measurement of lattice mismatch between the first electrode 121 and the seed layer 162.

Referring thereto, when the seed layer 162 was formed of AlN, the lattice mismatch between the first electrode 121 of a Mo material was measured to be 14.11%, whereas, when the seed layer 162 was formed of Ti having the HCP structure, the lattice mismatch between the first electrode of the Mo material was improved to be 8.24%.

Accordingly, when the seed layer 162 is formed of Ti, the crystal orientation of the first electrode 121 can be improved, and eventually, the crystal orientation of the piezoelectric layer 123 is significantly influenced.

The barrier layer 164 is disposed between the first electrode 121 and the piezoelectric layer 123.

The barrier layer 164 is disposed on the upper surface of the first electrode 121, and accordingly between the first electrode 121 and the piezoelectric layer 123, thereby improving the crystal orientation of the piezoelectric layer.

The barrier layer 164 may be formed of a metal having the HCP structure. In this case, lattice mismatch can be reduced between the first electrode 121 and the piezoelectric layer 123. As an example for such effect, the barrier layer 164 may include a Ti material. For example, the barrier layer 164 may be implemented with a Ti layer.

FIG. 6 is a diagram showing a result of measurement of lattice mismatch between the first electrode 121 and the piezoelectric layer 123.

Referring to FIG. 6, when the piezoelectric layer 123 was disposed on the first electrode 121 without the barrier layer 164, the mismatch between the first electrode of the Mo-material and the piezoelectric layer 123 of the AlScN-material was measured to be about 14.11%. However, in accordance with an embodiment disclosed herein, when the barrier layer 164 formed of a Ti-material is provided on the first electrode 121, the lattice mismatch between the barrier layer 164 and the piezoelectric layer 123 was improved to 5.42%.

The barrier layer 164 in the embodiment disclosed herein is disposed on the portion of the first electrode 121 in the center portion S having no insertion layer 170, and between the first electrode 121 and the insertion layer 170 in the extension portion E.

In the absence of the barrier layer 164, the insertion layer 170 is disposed directly on the first electrode 121. In this case, the insertion layer 170 is deposited and patterned on the first electrode 121 during the manufacture of the bulk-acoustic wave resonator 100.

However, a portion of the first electrode 121 may be removed by etching gas (for example, 02, C1) used in the patterning of the insertion layer 170. In this regard, surface roughness of the portion of the first electrode 121 arranged on the center portion S increases, which may be somewhat disadvantageous in the crystal orientation at the time of deposition/growth of the piezoelectric layer 123.

Accordingly, in an embodiment, the barrier layer 164 is formed of the material of the insertion layer 170 and a material having high dry etch selectivity. In this case, the frequency distribution due to loss of the first electrode 121 can be improved.

Further, when the barrier layer 164 is formed of a material helpful not only in the crystal orientation with the first electrode 121 but also in the crystal orientation of the piezoelectric layer 123, the crystal orientation of the piezoelectric layer 123 can be improved by the improved surface roughness of the first electrode 121.

As previously described, the barrier layer 164 is formed of Ti.

When the barrier layer 164 is formed of Ti, dry etch selectivity with the insertion layer 170 is excellent, and the lattice mismatch between the first electrode 121 and the piezoelectric layer 123 is reduced, thereby contributing to improvement of the crystal orientation.

However, the disclosure is not limited to the foregoing example, and if necessary, the insertion layer 170 may be manufactured first, followed by disposing the same between the first electrode 121 and the piezoelectric layer 123.

Figure 8:
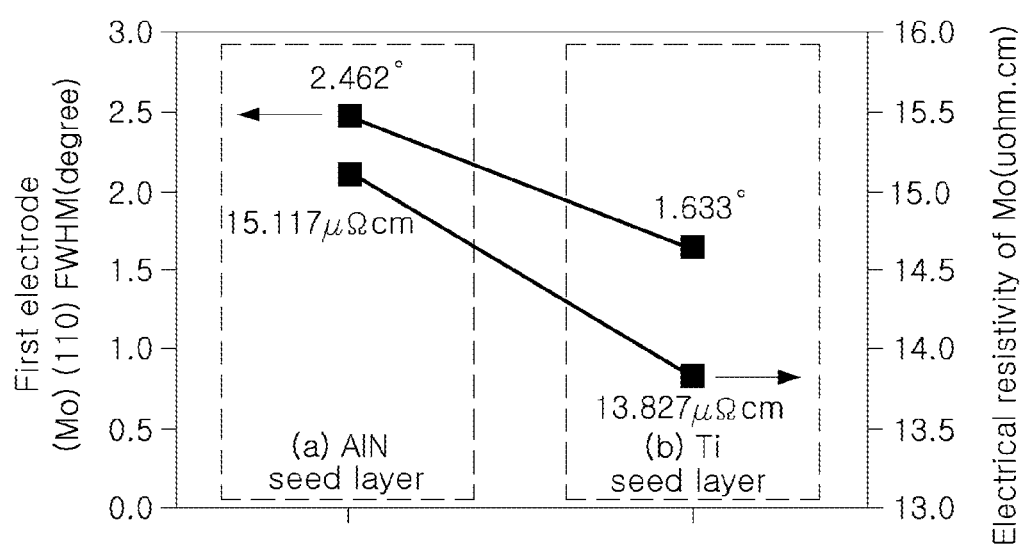
FIG. 8 is a graph of FIG. 7.

FIG. 7 is a diagram showing a result of measurement of crystal orientation of the first electrode 121. FIG. 8 is a graph of FIG. 7, illustrating the comparison of a case in which the seed layer 162 is formed of AlN and a case in which the seed layer is formed of Ti.

Referring to FIGS. 7 and 8, full width of half maximum (FWHM) of a crystal surface of the first electrode 121 in structure (a) in which the seed layer 162 is formed of AlN was 2.462°, whereas FWHM in structure (b) in which the seed layer 162 is formed of Ti was 1.633°, indicating significantly increased crystal orientation. Further, resistivity was shown to decrease when the seed layer 162 is formed of Ti compared to when the seed layer 162 is formed of AlN.

In this regard, the insertion loss of the bulk-acoustic wave resonator having the AlN-seed layer was measured to be 0.065 dB, whereas that of the bulk-acoustic wave resonator 100 having the Ti-seed layer was measured to be 0.041 dB, indicating the improved insertion loss of 0.024 dB.

Figure 9:
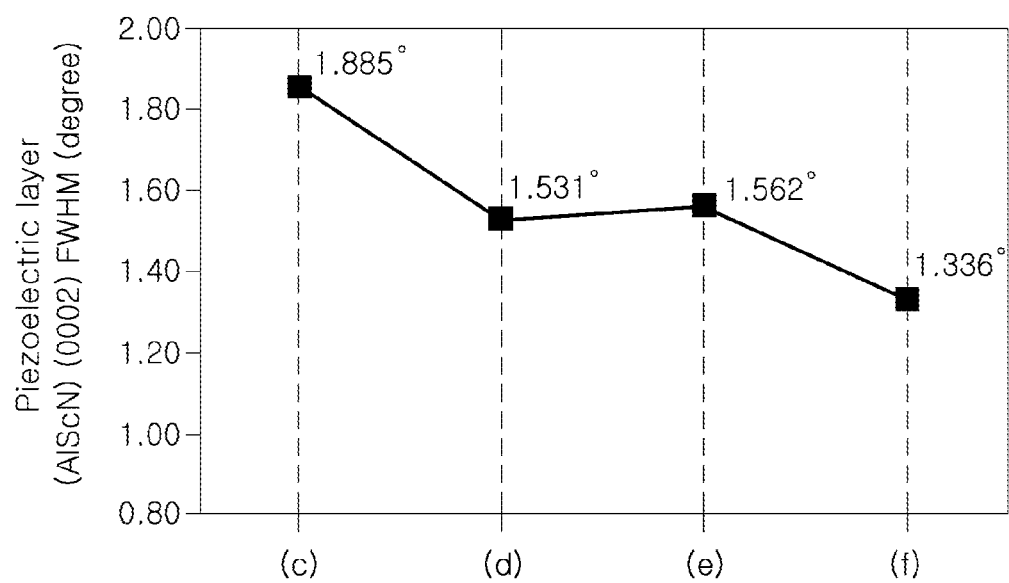
FIG. 9 is a graph illustrating crystal orientation of a piezoelectric layer measured by varying a material of a seed layer and presence of a barrier layer.

FIG. 9 is a graph illustrating crystal orientation of the piezoelectric layer 123 measured by varying a material of the seed layer 162 and presence of the barrier layer 164.

Structure (c) in FIG. 9 is a structure in which the seed layer 162 is formed of AlN and no barrier layer 164 is included, and structure (d) is a structure in which the seed layer 162 is formed of Ti and no barrier layer 164 is included, whereas structure (e) is a structure in which the seed layer 162 is formed of AlN and the barrier layer 164 is formed of Ti, and structure (f) is a structure in which the seed layer 162 and the barrier layer 164 are formed of Ti.

In the graph of FIG. 9, the thickness of the AlScN piezoelectric layer 123 is 400 nm, the thickness of the Mo-material first electrode 121 is 200 nm, and the thickness of the seed layer 162 is 50 nm.

Referring to FIG. 9, the FWHM of the crystal surface of the piezoelectric layer 123 in the structure (c) in which the seed layer 162 is formed of AlN was 1.855°, whereas that in the structure (f) in which both seed layer 162 and barrier layer 164 are formed of Ti was 1.366°, indicating significantly improved crystal orientation.

It can be also understood that the structure (f) has improved crystal orientation compared to the structure (d) including Ti-seed layer 162 only or the structure (e) in which the seed layer 162 is formed of Al and the barrier layer 164 is formed of Ti.

When the seed layer 162 formed of the Ti material and the barrier layer 164 of the Ti material are applied, the crystal orientation of the piezoelectric layer 123 of the AlScN material significantly improves, and thus, abnormal growth of the piezoelectric layer 123 can be suppressed. In this regard, the loss generated in the piezoelectric layer 123 is also reduced, thereby facilitating provision of a bulk-acoustic wave resonator appropriate for 5G communications.

Figure 10:
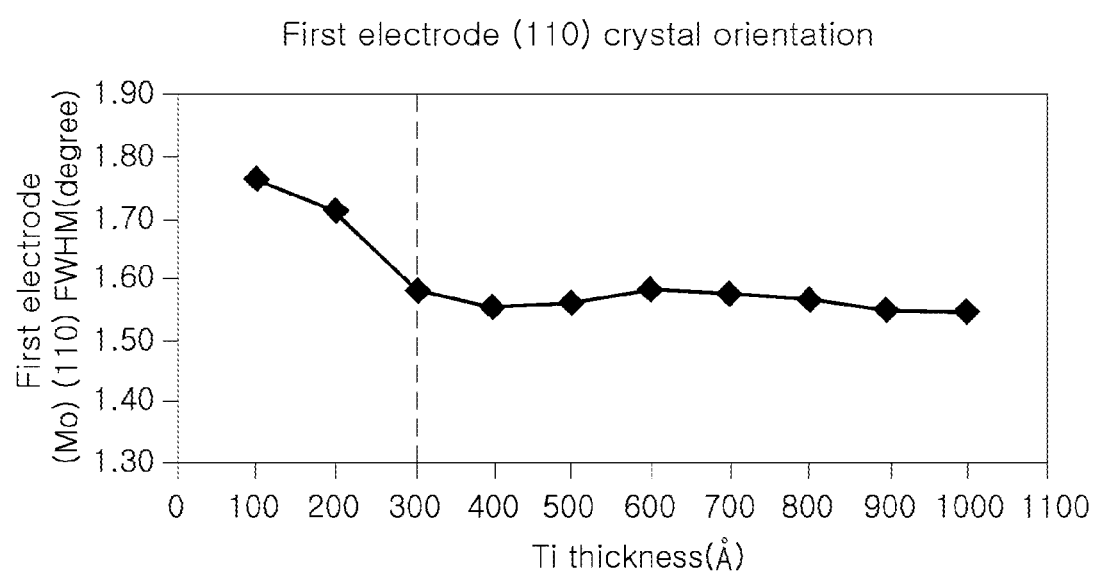
FIG. 10 is a graph of crystal orientation of a crystal surface of a first electrode obtained by analyzing X-ray diffraction (XRD) according to a thickness of the seed layer.

FIG. 10 is a graph of crystal orientation of a crystal surface 110 of the first electrode obtained by analyzing X-ray diffraction (XRD) according to a thickness of the seed layer.

Referring to FIG. 10, it is shown that, when the thickness of the seed layer 162 is less than 300 Å, the FWHM of the crystal surface 110 of the first electrode 121 formed of Mo dramatically increases, thereby reducing the crystal orientation thereof. Accordingly, in an embodiment disclosed herein, the thickness of the seed layer 162 is formed to be at least 300 Å.

When the seed layer 162 is thicker than the first electrode 121, sound wave loss increases in vibrations in a vertical direction of the bulk-acoustic wave resonator. In order to reduce such sound wave loss, the first electrode 121 and the second electrode 125 are formed of a material having high acoustic impedance. In an embodiment disclosed herein, however, the seed layer 162 is formed of a material having lower acoustic impedance than the first electrode 121.

Accordingly, when the seed layer 162 is thicker than the first electrode 121, sound wave loss in the vertical direction increases due to the low acoustic impedance, and thus, the piezoelectric properties of the bulk-acoustic wave resonator decrease. Further, since the seed layer 162 is a metal, the loss in the seed layer 162 may increase in terms of the free electron flow when the seed layer 162 is thicker than the first electrode 121.

In this regard, the seed layer 162 in an embodiment disclosed herein is formed to be thinner than the first electrode 121.

In the case of the seed layer 162 being a Ti thin film, a crystal surface (1-210) begins to form in addition to the Ti crystal surface 0002 when the thickness is at least 1000 Å. This may have an adverse effect on the crystal orientation of either the first electrode 121 or the piezoelectric layer 123. Accordingly, the thickness of the seed layer 162 in an embodiment may be in the range of 300 Å to 1000 Å.

Figure 11:
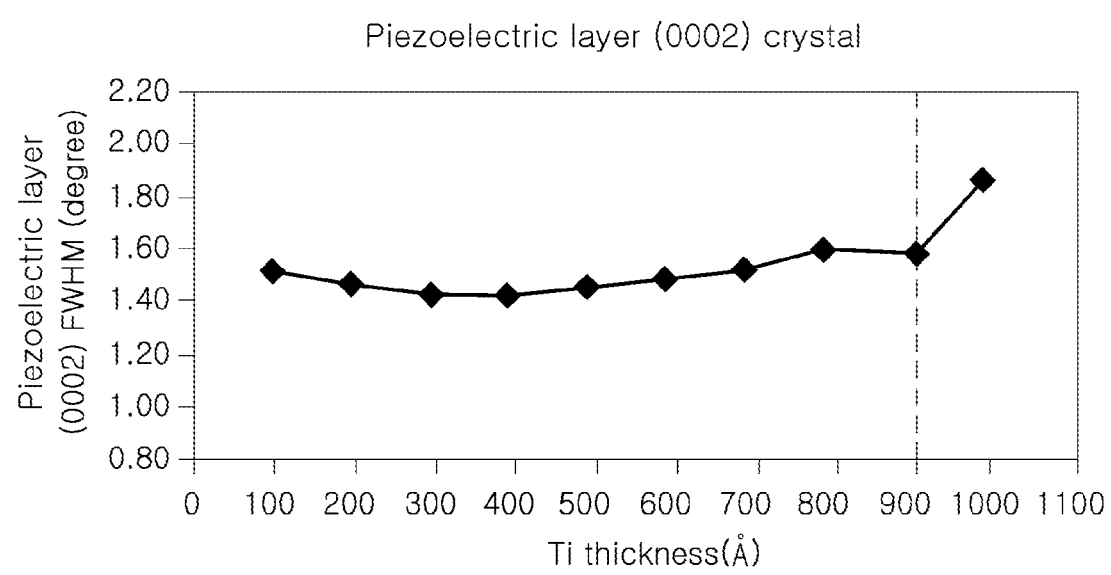
FIG. 11 is a graph of crystal orientation of a crystal surface of a piezoelectric layer obtained by analyzing X-ray diffraction (XRD) according to a thickness of a barrier layer.

FIG. 11 is a graph of crystal orientation of a crystal surface 0002 of the piezoelectric layer obtained by analyzing X-ray diffraction (XRD) according to a thickness of the barrier layer 164.

Referring to FIG. 11, it is shown that, when the thickness of the barrier layer is greater than 900 Å, the FWHM of the crystal surface 0002 of the piezoelectric layer 123 dramatically increases, thereby reducing the crystal orientation. Accordingly, the thickness of the barrier layer 164 in an embodiment is formed to be 900 Å or less.

When the thickness of the barrier layer is 100 Å or less, the HPC crystal structure of the barrier layer cannot be easily formed, and there may be a pinhole, or the like formed on the thin film constituting the barrier layer. This may influence the crystal orientation of the piezoelectric layer 123, which is subsequently deposited. Further, when the barrier layer is formed to have a thickness of 100 Å or less, difficulty of the manufacturing process may increase due to a lack of a thickness margin in the patterning or a subsequent process thereof.

Accordingly, the barrier layer 164 in an embodiment is formed to have a thickness of at least 100 Å.

The bulk-acoustic wave resonator 100 according to embodiment having the described constitution may suppress abnormal growth by improving the crystal orientation of the piezoelectric layer 123. In this regard, the loss generated in the piezoelectric layer 123 can be minimized, thereby providing a bulk-acoustic wave resonator appropriate for 5G communications.

The disclosure is not limited to the previously described embodiments, and may be embodied in various forms.

Figure 12:
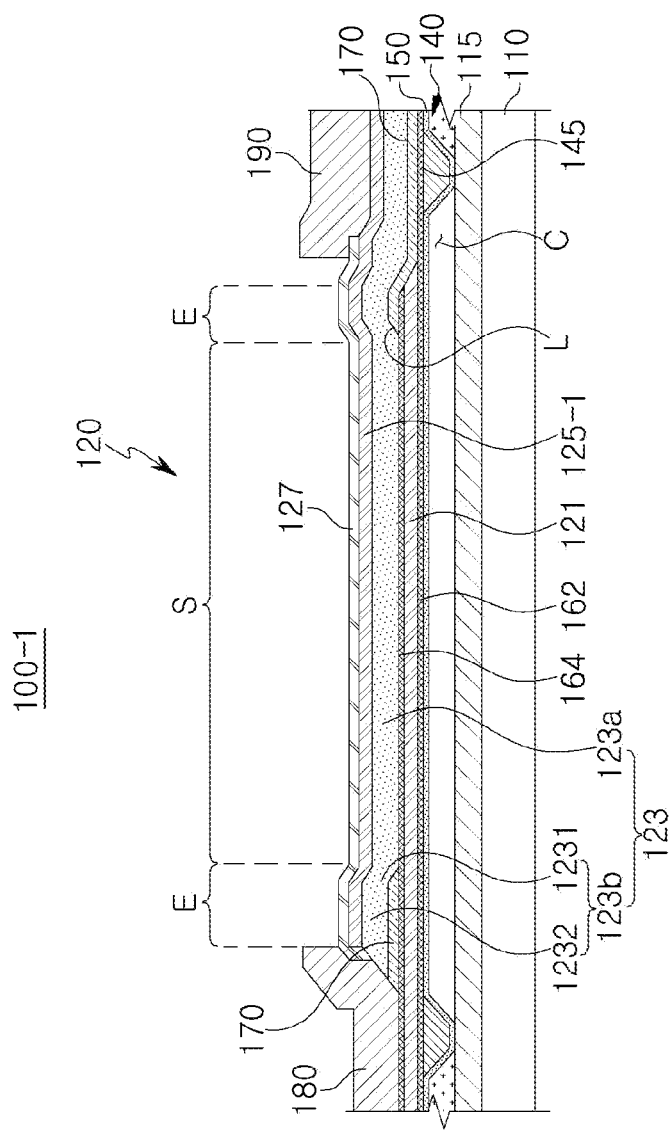
FIGS. 12 and 13 are schematic diagrams of bulk-acoustic wave resonators, according to embodiments.
Figure 13:
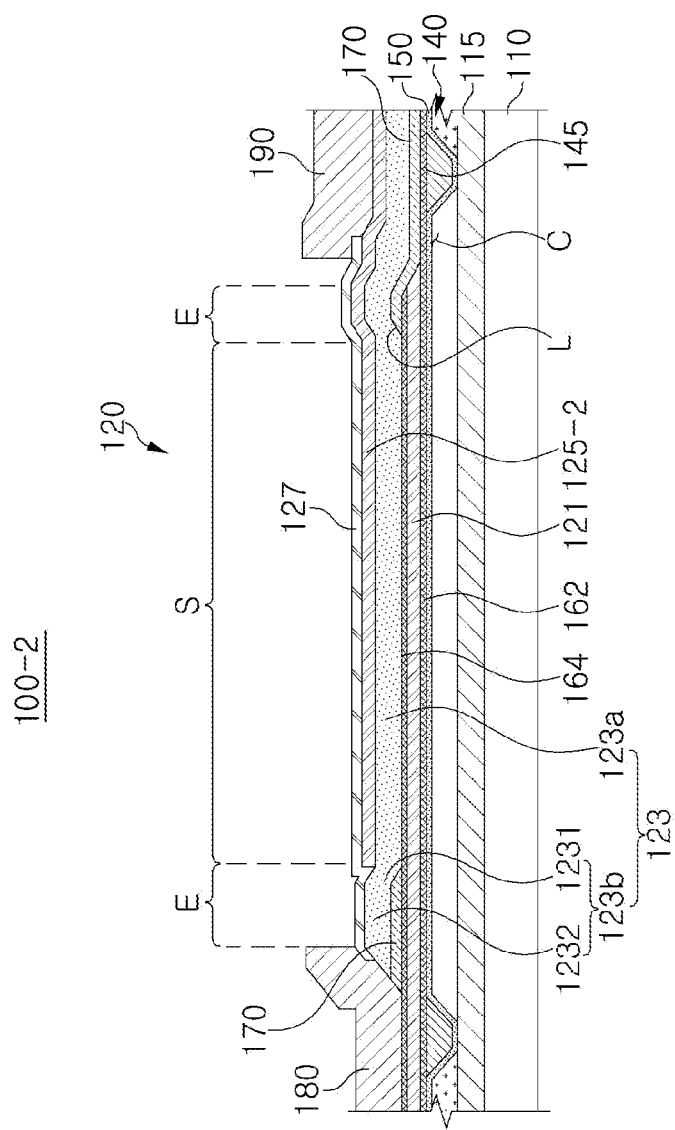

FIGS. 12 and 13 are schematic diagrams of a bulk-acoustic wave resonators 100-1 and 100-2, respectively, according to embodiments.

Referring to FIG. 12, the bulk-acoustic wave resonator 100-1 includes a second electrode 125-1 disposed on the entire upper surface of the piezoelectric layer 123. Accordingly, the second electrode 125-1 is also formed on the extension portion 1232, in addition to the inclined portion 1231 of the piezoelectric layer 123.

Referring to FIG. 13, in the bulk-acoustic wave resonator 100-2, an end portion of a second electrode 125-2 is formed only on the upper surface of the piezoelectric portion 123a of the piezoelectric layer 123 and not on the curved portion 123b of the piezoelectric layer 123, in view of a cross-section of the resonance portion 120 taken on a line through the center portion S. In this regard, the end of the second electrode 125-2 is disposed along a boundary between the piezoelectric portion 123a and the inclined portion 1231.

As described above, a bulk-acoustic wave resonator may be embodied in various forms if necessary. For example, in the previously described embodiments, both the Ti-seed layer 162 and the Ti-barrier layer 164 are provided in the bulk-acoustic wave resonator. However, even when only one of the Ti-seed layer 162 and the Ti-barrier layer 164 is provided, lattice mismatch can be reduced by improving the crystal orientation. Accordingly, it is possible to include either one of the Ti-seed layer 162 and the Ti-barrier layer 164, if necessary.

A bulk-acoustic wave resonator according to the disclosure herein improves crystal orientation of the piezoelectric layer through the seed layer and the barrier layer, and thus can prevent abnormal growth. Accordingly, loss generated from the piezoelectric layer can be minimized. Therefore, a bulk-acoustic wave resonator appropriate for 5G communication can be provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a substrate;
a resonance portion;
a first electrode disposed on the substrate;
a piezoelectric layer disposed on the first electrode in the resonance portion;
a second electrode disposed on the piezoelectric portion in the resonance portion; and
a seed layer disposed in a lower portion of the first electrode;
wherein the seed layer is formed of titanium (Ti) having a hexagonal close packed (HCP) structure, or an alloy of Ti having the HCP structure,
wherein the seed layer has a thickness greater than or equal to 300 Å and less than or equal to 1000 Å, or is thinner than the first electrode, and
wherein the piezoelectric layer comprises aluminum nitride (AlN) and the AlN comprises 20 wt % to 40 wt % of scandium (Sc).

2. The bulk-acoustic wave resonator of claim 1, wherein the first electrode is formed of molybdenum (Mo).

3. The bulk-acoustic wave resonator of claim 1, further comprising an insertion layer partially disposed in the resonance portion and disposed between the first electrode and the piezoelectric layer, and
wherein the piezoelectric layer is partially raised by the insertion layer.

4. The bulk-acoustic wave resonator of claim 3, wherein the insertion layer comprises an inclined surface, and the piezoelectric layer comprises an inclined portion disposed on the inclined surface.

5. The bulk-acoustic wave resonator of claim 4, wherein an end of the second electrode is disposed on the inclined portion.

6. The bulk-acoustic wave resonator of claim 4, wherein the piezoelectric layer comprises an extension portion disposed on an external side of the inclined portion, and at least a portion of the second electrode is disposed on the extension portion.

7. A bulk-acoustic wave resonator, comprising:
a substrate;
a resonance portion;
a first electrode disposed on the substrate;
a piezoelectric layer disposed on the first electrode in the resonance portion;
a second electrode disposed on the piezoelectric layer in the resonance portion;
a barrier layer disposed between the piezoelectric layer and the first electrode; and
an insertion layer partially disposed in the resonance portion and disposed at least partially on the barrier layer between the first electrode and the piezoelectric layer such that the piezoelectric layer is partially raised by the insertion layer,
wherein the barrier layer is formed of titanium (Ti) having a hexagonal close packed (HCP) structure or an alloy of Ti having the HCP structure, and
wherein the barrier layer has a thickness of 100 Å to 900 Å.

8. The bulk-acoustic wave resonator of claim 7, wherein the piezoelectric layer comprises aluminum nitride (AlN) or AlN comprising scandium (Sc).

9. The bulk-acoustic wave resonator of claim 8, the piezoelectric layer is formed of aluminum nitride comprising 20 wt % to 40 wt % of Sc.

10. The bulk-acoustic wave resonator of claim 7, wherein the first electrode is formed of molybdenum (Mo).

11. A bulk-acoustic wave resonator, comprising:
a substrate;
a resonance portion;
a first electrode disposed on the substrate;
a piezoelectric layer disposed on the first electrode in the resonance portion;
a second electrode disposed on the piezoelectric layer in the resonance portion;
a seed layer disposed in a lower portion of the first electrode;
a barrier layer disposed between the piezoelectric layer and the first electrode; and
an insertion layer partially disposed in the resonance portion and disposed at least partially on the barrier layer between the first electrode and the piezoelectric layer such that the piezoelectric layer is partially raised by the insertion layer,
wherein the seed layer and the barrier layer are formed of titanium (Ti) having a hexagonal close packed (HCP) structure or an alloy of Ti having the HCP structure.

12. The bulk-acoustic wave resonator of claim 11, wherein a thickness of the seed layer is 300 Å to 1000 Å.

13. The bulk-acoustic wave resonator of claim 12, wherein a thickness of the barrier layer is 100 Å to 900 Å.

14. The bulk-acoustic wave resonator of claim 11, wherein a thickness of the barrier layer is 100 Å to 900 Å.

* * * * *